United States Patent [19]

Beneking

[11] Patent Number: 5,273,918
[45] Date of Patent: Dec. 28, 1993

[54] PROCESS FOR THE MANUFACTURE OF A JUNCTION FIELD EFFECT TRANSISTOR

[75] Inventor: Heinz Beneking, Aachen, Fed. Rep. of Germany

[73] Assignee: Temic Telefunken microelectronic GmbH, Heilbronn, Fed. Rep. of Germany

[21] Appl. No.: 823,052

[22] Filed: Jan. 16, 1992

Related U.S. Application Data

[63] Continuation of Ser. No. 339,861, Apr. 17, 1989, abandoned, which is a continuation of Ser. No. 28,768, Mar. 23, 1987, abandoned, which is a continuation-in-part of Ser. No. 688,805, Dec. 28, 1984, abandoned.

[30] Foreign Application Priority Data

Jan. 26, 1984 [DE] Fed. Rep. of Germany ....... 3402517

[51] Int. Cl.$^5$ .......................................... H01L 21/338
[52] U.S. Cl. ........................................ 437/40; 437/38; 437/39; 437/174; 437/175; 437/944; 437/911; 437/984; 148/DIG. 100
[58] Field of Search ................. 437/40, 912, 911, 944, 437/175, 174, 176, 229, 38, 39, 41; 148/DIG. 100; 156/659.1; 257/280, 284, 256

[56] References Cited

U.S. PATENT DOCUMENTS

| | | | |
|---|---|---|---|
| 3,764,865 | 10/1973 | Napoli et al. | 357/22 |
| 3,938,241 | 2/1976 | George et al. | 437/911 |
| 4,229,232 | 10/1980 | Kirkpatrick | 437/247 |
| 4,248,948 | 2/1981 | Matsuda | 437/944 |
| 4,331,485 | 5/1982 | Gat | 437/16 |
| 4,364,778 | 12/1982 | Leamy et al. | 437/176 |
| 4,402,127 | 9/1983 | Pham et al. | 437/41 |
| 4,451,843 | 5/1984 | Dahlberg | 357/36 |
| 4,476,622 | 10/1984 | Cogan | 437/911 |
| 4,503,600 | 3/1985 | Nii et al. | 437/944 |
| 4,566,021 | 1/1986 | Yokoyama | 557/15 |

FOREIGN PATENT DOCUMENTS 2926785 1/1981 Fed. Rep. of Germany .
0048177 5/1981 Japan .
0014577 1/1983 Japan .

OTHER PUBLICATIONS

Ashok, S., et al., *Thin Solid Films*, 126 (1985) 251–256.
Davies, D. E., *IEEE Electron Device Letters*, vol. ED-L-6, No. 8, Aug. 1985, pp. 397–399.
Vescan, L., et al., *J. Crystal Growth*, 73(1985), 482–486.
Shannon, J. M., et al., *Vacuum*, vol. 34, Nos. 1–2, 1984, pp. 193–197.
Patent Abstracts of Japan, E-170, Apr. 12, 1983, vol. 7, No. 88, 58–14577.
Colclaser, R. A., *Microelectronics: Processing & Device Design*, John Wiley & Sons, 1980, TIC 7874.C63, pp. 154–155, 319–322.
Patent Abstracts of Japan, E-65, Jul. 15, 1981, vol. 5, No. 1, 56–48177.
J. B. Boos, "Fully Ion Implanted InP Junction FET's", IEEE Electron Device Letters, vol. EDL-3, No. 9, (Sep. 1982), pp. 256–258.

*Primary Examiner*—T. N. Quach
*Attorney, Agent, or Firm*—Spencer, Frank & Schneider

[57] ABSTRACT

The invention relates to a process for producing a junction field effect transistor in which the surface layer provided for conducting the current has a reduced cross-section in the channel area. The gist of the invention is that a photoresist mask is applied to the surface layer of the first conductivity type which is initially of uniform thickness. The surface layer is removed to a residual thickness through an opening in the photoresist mask. Impurities are then implanted into the surface layer through the same opening in the aforesaid mask to produce a zone of the second or opposite conductivity type. Finally, the aforementioned mask is used as a contacting mask for the manufacture of the gate electrode.

12 Claims, 1 Drawing Sheet

PROCESS FOR THE MANUFACTURE OF A JUNCTION FIELD EFFECT TRANSISTOR

This application is a continuation application under 37 DFR 1.62 of prior application Ser. No. 07/339,861, filed on Apr. 17, 1989, abandoned, which is a Continuation of Ser. No. 07/028,768, filed on Mar. 23, 1987, abandoned, which is a continuation-in-part of Ser. No. 06/688,805, filed on Dec. 28, 1984, abandoned.

BACKGROUND OF THE INVENTION

The invention relates to a process for the manufacture of a junction field effect transistor in which a surface layer which is provided for conducting the current and which is of reduced thickness below the area provided for the gate electrode between the source electrode and the drain electrode is arranged on the surface of a base member.

SUMMARY OF THE INVENTION

The object underlying the invention is to indicate a process for manufacturing such a junction field effect transistor which may be performed with very few procedural steps and produces junction field effect transistors with reproducible results. The process according to the invention in particularly suitable for the manufacture of high frequency transistors, i.e., transistors of a very small size. This object is generally attained according to the invention by applying a photoresist mask to a surface layer of the first conduction type, which is initially of uniform thickness, with the photoresist mask being provided with an opening through which the surface layer is removed to a residual thickness, with impurities causing the second conduction type being subsequently implanted into the surface layer through the same opening, and with the mask finally being used as a contacting mask in the manufacture of the gate electrode.

The invention has the substantial advantage that the same resist mask may be used for etching the surface layer, for implanting the impurities and for applying the gate electrode. This results in a substantial simplification of the overall manufacturing process, with a clear adjustment of the gate electrode onto the area of reduced cross-section of the surface layer.

BRIEF DESCRIPTION OF THE DRAWINGS

The invention will now be described in greater detail with reference to an embodiment, with FIGS. 1 to 4 showing various manufacturing stages in the cross-section through the semiconductor arrangement.

DETAILED DESCRIPTION OF THE PREFERRED EMBODIMENT

Figure 1:
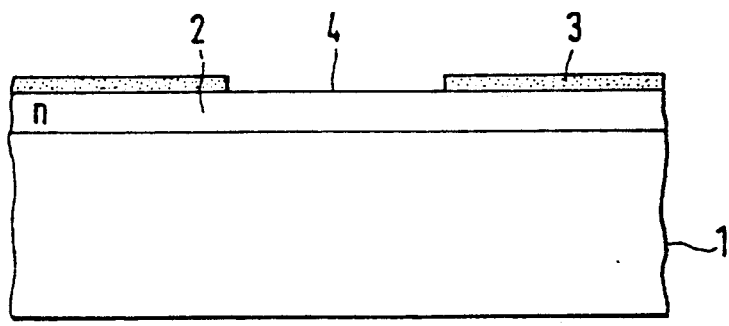

According to FIG. 1, one starts with a substrate member 1 which is provided with a surface layer 2 of the first conduction type on the surface side. The substrate member may, for example, consist of silicon and would then be of the conduction type opposite to that of layer 2, or it would be self-conducting. In another preferred embodiment, which is particularly well suited for the manufacture of extremely high frequency transistors, the substrate 1 consists of semi-insulating gallium arsenide with a surface layer 2 which may, for example, be n-conducting, and have a thickness of between 0.2 and 0.5 μm. A photoresist mask 3 is applied to the surface layer 2, with the resist layer having, for example, a thickness of 1 μm. By means of exposure and development, an opening 4 is made in this photoresist layer 3 above the area of layer 2 provided for the channel. The photoresist layer 3 with its opening 4 now serves for etching and implanting the layer 2 and also for applying the gate electrode.

Figure 2:
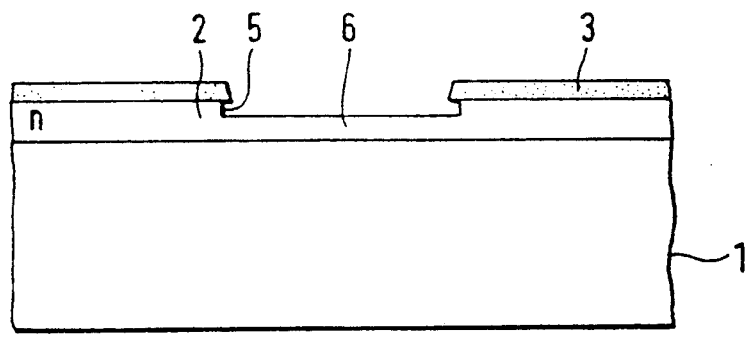

As is apparent from FIG. 2, the surface layer 2 of the first conduction type is now removed to a residual thickness of approximately 0.1 μm in the area of the opening 4 in the photoresist mask 3. The removal may be carried out by chemical etching or by reactive ion etching.

Figure 3:
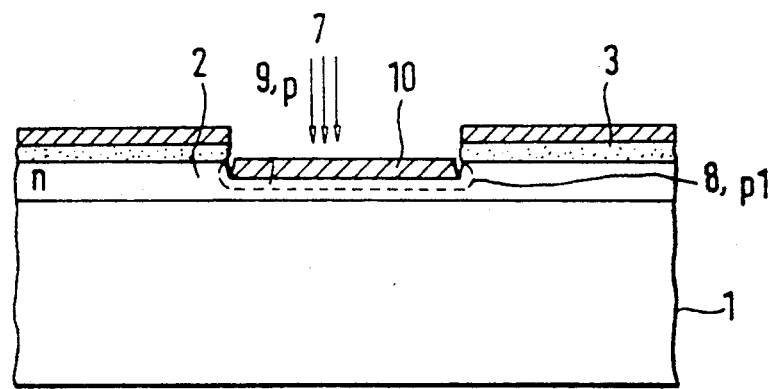

In accordance with FIG. 3, a pn-junction 8 is then inserted into the area 6 of reduced cross-section of the surface layer 2. To this end, ions are implanted into the channel area 6 through the opening 4 in the photoresist mask 3 and cause a transformation of the conductivity type after annealing. If, for example, the surface layer 2 consists of n-conducting gallium arsenide, beryllium or zinc ions may be used as the implantation material 7. The implanted ions produce a p-conducting zone 9 which, depending on the implantation dose, fills out the channel area 6 more or less completely. If p-conducting surface layers 2 of gallium arsenide are used, sulphur or selenium may be used as the implantation material 7 in order to produce n-doped zones 9.

If a self-blocking junction field effect transistor is to be produced, either the entire channel area 6 can be counterdoped if the length of the channel area 6 is sufficiently short, i.e., 200 or less, so that a gate voltage controlled potential barrier is developed, or the entire channel area 6 is counterdoped only so deeply that the developed depletion region extends to the base material of substrate 1. To produce self-conducting transistors, on the other hand, only a portion of the depth of the channel 6, for example, up to a depth of 50 nm, is counterdoped. The implantation is carried out using conventional ranges of ion doses, for example a range of approximately $10^{14}$–$10^{16}$cm$^{-2}$ for silicon and a slightly lower range for gallium arsenide. For example, a self conducting transistor with a 50 nm deep counterdoped zone 9 formed in a silicon layer 2 of $N_D=3\times10^{17}$cm$^{-3}$ can be produced by using a dose of $10^{14}$cm$^{-2}$ of Beryllium with an implantation energy of 10keV. This results in a transistor with a channel width of approximately 24 nm below the developed depletion region. The low energy of approximately 10 keV is preferably used for the implantation in view of the low penetration depths of the implantation material.

The implanted impurities may now be annealed, for example, with a laser beam, through the opening 4 in the photoresist mask 3. After the annealing process, the gate electrode 10 is applied to the zone 9 by using the photoresist mask 3. The metal or contact material also deposited on the photoresist mask may the be removed together with the resist mask 3 in a conventional manner.

There also is the possibility of applying a gate electrode 10 made of temperature-resistant material to zone 9 before annealing the implanted ions. Such an electrode may, for example, be a silicide electrode. After removal of the photoresist masks, the annealing process for annealing the implanted ions may be performed, for which purpose the so-called flash annealing is particularly recommendable. During flash annealing, the semiconductor arrangement is heated up to a temperature of approximately 1,000 degrees Celsius within a few seconds, and is then kept at this temperature for about 25 seconds. This short-time annealing process has the advantage that the implanted profile is practically unchanged by the annealing, and yet a good annealing of the charge carriers is achieved.

Figure 4:
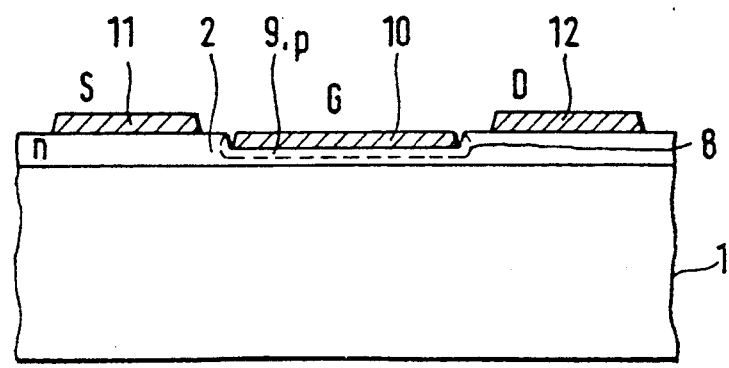

Finally, FIG. 4 shows the finished semiconductor arrangement after removal of the photoresist layer 3.

To complete the arrangement, the source electrode 11 and the drain electrode 12 still have to be disposed to the left and right of the gate electrode 10 on the surface layer 2 of the first conduction type.

What is claimed is:

1. A process for the manufacture of a junction field effect transistor in which a surface layer of one conductivity type, which is provided for conducting the current and which is of reduced thickness below the area provided for the gate electrode between the source electrode and the drain electrode is arranged on the surface of a base member; said process comprising the steps of: applying a photoresist mask layer, which is provided with an opening, to said surface layer of the first conductivity type, which is initially of a uniform thickness; using said photoresist layer as an etching mask, removing said surface layer to a residual thickness through said opening; subsequently, using said photoresist layer as an implantation mask, implanting impurities causing the second conductivity type into the surface layer through the same said opening of said photoresist layer; and thereafter, using said photoresist layer as a contacting mask, forming the gate electrode by applying conductive material to the surface region of said surface layer through the same said opening of said photoresist layer.

2. A process according to claim 1, wherein a surface layer with an initial thickness of 0.2–0.5 μm is used, and is removed to a residual thickness of approximately 0.1 μm in the area provided for the gate electrode.

3. A process according to claim 2, wherein ions are implanted into the thin area of the surface layer which convert the surface layer to a penetration depth of approximately 50 nm into a zone of the second conductivity type in order to produce a self-conducting transistor.

4. Process according to claim 1, wherein ions are implanted into the thin area of the surface layer which partially convert the surface layer to a penetration depth of approximately 50 nm into a zone of the second conductivity type in order to produce a self-conducting transistor.

5. A process according to claim 1, wherein the implanted impurities are annealed by a laser beam or by a short-time flash annealing.

6. A process according to claim 1 wherein the implanted impurities are annealed by a laser beam via said opening prior to using said photoresist layer as a contacting mask.

7. A process according to claim 1 wherein said photoresist layer is used as a contacting mask by applying a gate electrode formed of a temperature resistance material to the surface region of said surface layer through said opening in said photoresist layer; and further comprising: thereafter removing said photoresist layer and then annealing the implanted impurities by a short-time flash annealing process.

8. A process for the manufacture of a field effect transistor in which a surface layer of one conductivity type, which is provided for conducting the current, is arranged on the surface of a base member and is of reduced thickness below the area provided for the gate electrode between the source electrode and the drain electrode; said process comprising the steps of: applying a photoresist layer provided with an opening to said surface layer of the first conductivity type, which is initially of a uniform thickness; using said photoresist layer as a mask, etching said surface layer to a residual thickness through said opening; subsequently implanting impurities causing the second conductivity type into the surface layer, using said photoresist layer as a mask and through the same said opening of said photoresist layer, to convert a portion of the residual thickness of said surface layer to said second conductivity type; using said photoresist layer as a contact mask, applying a gate electrode formed of a temperature resistance material to the surface region of said surface layer through the same said opening in said photoresist layer and thereafter removing said photoresist layer and annealing the implanted impurities.

9. A process according to claim 8, wherein said surface layer is removed to a residual thickness of approximately 0.1 μm in the area provided for the gate electrode.

10. A process according to claim 9, wherein said surface layer initially has a thickness of 0.2–0.5 μm.

11. A process according to claim 8, wherein the implanted impurities are annealed by a laser beam or by short-time flash annealing.

12. A process according to claim 8, including annealing the implanted impurities by short-time flash annealing after removing said photoresist layer.

* * * * *